United States Patent

Kishida et al.

[11] Patent Number: 5,587,274
[45] Date of Patent: Dec. 24, 1996

[54] RESIST COMPOSITION

[75] Inventors: Takahito Kishida, Yao; Akira Matsumura, Hirakata; Atsushi Kawakami, Suita, all of Japan

[73] Assignee: Nippon Paint Co., Ltd., Osaka-fu, Japan

[21] Appl. No.: 350,733

[22] Filed: Dec. 7, 1994

Related U.S. Application Data

[63] Continuation-in-part of Ser. No. 77,377, Jun. 17, 1993, abandoned.

[30] Foreign Application Priority Data

Jun. 19, 1992 [JP] Japan .................................. 4-160840

[51] Int. Cl.$^6$ ........................................ G03C 1/73
[52] U.S. Cl. ................... 430/270.1; 430/326; 430/910; 522/149
[58] Field of Search ................... 430/270, 326, 430/910; 522/149

[56] References Cited

U.S. PATENT DOCUMENTS

| | | | |
|---|---|---|---|
| 4,491,628 | 1/1985 | Ito et al. ................... | 430/270 |
| 5,045,431 | 9/1991 | Allen et al. ................... | 430/270 |
| 5,077,174 | 12/1991 | Bauer et al. ................... | 430/270 |
| 5,102,771 | 4/1992 | Vogel et al. ................... | 430/270 |
| 5,356,979 | 10/1994 | Tai et al. ................... | 524/401 |

FOREIGN PATENT DOCUMENTS

| | | |
|---|---|---|
| 0102450 | 3/1984 | European Pat. Off. . |
| 2609218 | 9/1976 | Germany . |
| 63-259657 | 10/1988 | Japan . |

OTHER PUBLICATIONS

Japanese Abstract of 58–118641 published Jul. 14, 1983.
Japanese Abstract of 57–8541 published Jan. 16, 1982.

Primary Examiner—George F. Lesmes
Assistant Examiner—Laura Weiner
Attorney, Agent, or Firm—Wenderoth, Lind & Ponack

[57] ABSTRACT

Disclosed is a positive type resist composition which can form a good pattern by subjecting a resist layer to plural exposures and developments, which results in excellent adhesion between the resist layer and a substrate. The composition comprises:

(a) a polymer having an acid value of 2 to 200, prepared from 20 to 94% by weight of a t-butyl ester of a α,β-ethylenically unsaturated carboxylic acid, 5 to 79% by weight of a (meth)acrylate of the formula:

$$CH_2=C(R_1)-COO-(R_2-O)_n-R_3 \qquad I$$

wherein $R_1$ is hydrogen or a methyl group, $R_2$ represents $$\begin{array}{c} R_4 \\ | \\ -C-R_6- \\ | \\ R_5 \end{array}$$

wherein $R_4$ represents hydrogen or an alkyl group, $R_5$ represents hydrogen or an alkyl group, $R_6$ represents a branched or straight chain alkylene group, provided that a total carbon number of $R_4$, $R_5$ and $R_6$ is 1 to 5, $R_3$ is an alkyl group, an aryl group or an aralkyl group having 1 to 6 carbon atoms, and n is an integer of 1 to 10 and 1 to 75% by weight of another α,β-ethylenically unsaturated compound; and (b) a photoactivator which generates an acid in response to a light irradiation.

5 Claims, No Drawings

RESIST COMPOSITION

This is a continuation-in-part application of Ser. No. 08/077,377, filed Jun. 17, 1993, now abandoned.

FIELD OF THE INVENTION

The present invention relates to a positive type resist composition useful for producing printed plates, integrated circuits, color filters and the like. More particularly, it relates to a positive type resist composition capable of conducting exposure and development several times.

BACKGROUND OF THE INVENTION

With the recent development of manufacturing technique of integrated circuits, there has been desired a positive type resist capable of forming a photolithographic pattern having high resolution. In a photolithography method using the positive type resist, the exposed part is removed. Accordingly, the remaining non-exposed part is not modified with light even after the exposed part is removed and, therefore, a pattern can be formed by an additional exposure and development.

As the positive type resist composition, for example, a combination of a compound which generates acids in response to a light irradiation with a polymer having a moiety which is decomposed by attack of generated acids to form an alkali-soluble group has been proposed. For example, Japanese Patent Kokoku No. 2-27660 discloses a combination of a polymer having t-butyl ester groups of carboxylic acids or t-butyl carbonate groups of phenols with a compound which generates an acid in response to a light irradiation. Also, Japanese Patent Kokai No. 3-31845 discloses a combination of a copolymer prepared from a monomer having a t-butyl ester group and another vinyl monomer with an aryl onium salt which generates an acid in response to a light irradiation.

The positive type resist composition ideally can form a good pattern by exposing and developing the non-exposed part again, even after it was once exposed and developed. However, the positive type resist composition actually has poor resolution of pattern after the second exposure and development. Further, the conventional positive type resist composition does not have sufficient adhesion between the resist layer and a substrate and it is inconvenient to treat.

OBJECTS OF THE INVENTION

The main object of the present invention is to provide a novel positive type resist composition which can form a good pattern by conducting exposure and development several times, which results in excellent adhesion between the resist layer and a substrate.

This object as well as other objects and advantages of the present invention will become apparent to those skilled in the art from the following description.

SUMMARY OF THE INVENTION

According to the present invention, there is provided a positive type resist composition which comprises:

(a) a polymer having an acid value of 2 to 200, prepared from 20 to 94% by weight of a t-butyl ester of a α,β-ethylenically unsaturated carboxylic acid, 5 to 79% by weight of a (meth)acrylate of the formula:

$$CH_2=C(R_1)-COO-(R_2-O)_n-R_3 \quad \text{I}$$

wherein $R_1$ is hydrogen or a methyl group, $R_2$ represents

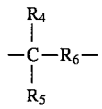

wherein $R_4$ represents hydrogen or an alkyl group, $R_5$ represents hydrogen or an alkyl group, $R_6$ represents a branched or straight chain alkylene group, provided that a total carbon number of $R_4$, $R_5$ and $R_6$ is 1 to 5 (e.g., an ethylene, n- or iso-propylene, n-, iso- or t-butylene, n, iso- or neo-pentylene or n- or iso hexylene group), $R_3$ is an alkyl group (e.g. methyl, ethyl, propyl, butyl, pentyl and hexyl group) having 1 to 6 carbon atoms, a substituted or non-substituted aryl group or an aralkyl group (e.g. benzyl group), and n is an integer of 1 to 10 and 1 to 75% by weight of another α,β-ethylenically unsaturated compound other than the above two mentioned monomers; and (b) a photoactivator which generates an acid in response to a light irradiation.

DETAILED EXPLANATION OF THE INVENTION

The polymer (a) employed in the positive type resist composition of the present invention is an acrylic copolymer which is formed from the t-butyl ester of the α,β-ethylenically unsaturated carboxylic acid, the (meth)acrylate represented by the formula (I) and the other α,β-ethylenically unsaturated compound.

The t-butyl ester groups are appended to the polymer (a). The t-butyl ester groups are decomposed by a catalytic reaction (i.e. attack of an acid generated from the photoactivator) to generate an isobutene group and a carboxyl group. As a result, a hydrophilic functional group is formed at the exposed part of a resist membrane, thus developing with an alkali developer.

The pendant t-butyl ester group is introduced into the polymer (a) by using the t-butyl ester of the α,β-ethylenically unsaturated carboxylic acid. Preferred examples of the t-butyl ester of the α,β-ethylenically unsaturated carboxylic acid include t-butyl esters of monocarboxylic acids (e.g. acrylic acid, methacrylic acid, crotonic acid, 2-(meth)acryloyloxyethylsuccinic acid, 2-(meth)acryloyloxyethylphthalic acid, 2-(meth)acryloyloxyethylhexahydrophthalic acid, etc.), dicarboxylic acids (e.g. maleic acid, fumaric acid, citraconic acid, mesaconic acid, itaconic acid, etc.), acid anhydrides (e.g. maleic anhydride, itaconic anhydride, etc.), monoesters of dicarboxylic acids (e.g. monoethyl maleate, monoethyl fumarate, monoethyl itaconate, etc.), and a mixture thereof and the like.

The amount of the t-butyl ester of the α,β-ethylenically unsaturated carboxylic acid contained in the polymer (a) is 20 to 94% by weight, preferably 30 to 92% by weight, more preferably 40 to 88% by weight, based on the total weight of the monomer used for the preparation of the polymer (a). When the amount of the t-butyl ester of the α,β-ethylenically unsaturated carboxylic acid is smaller than 20% by weight, the amount of the carboxylic acid formed in the resist layer of the exposed part becomes small and, therefore, it is difficult to develop with an alkali developer. Further, the difference in dissolution rate between the resist layer of the exposed part and that of the non-exposed part becomes small and, therefore, it is difficult to form a pattern having high resolution. When the amount of the t-butyl ester of the α,β-ethylenically unsaturated carboxylic acid exceeds 94% by weight, the amount of the (meth)acrylate of the formula (I) and the other α,β-ethylenically unsaturated compound contained in the polymer (a) becomes small, which results in poor pattern forming ability after exposing and developing two times or more.

Further, the polymer (a) used in the present invention has a side chain of a structure represented by the formula:

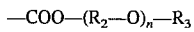
$$-COO-(R_2-O)_n-R_3 \qquad II$$

wherein $R_2$, $R_3$ and n are as defined above.

The side chain improves solubility of the resist layer of the exposed part, and significantly reduces developing defects (e.g. residual thin film, residual scum, etc.) even if the resist layer is subjected to exposures and developments several times. Further, it improves adhesion between the resist layer and the substrate, and significantly reduces peeling of the resist layer and the formation of cracks.

The side chain of the formula (II) is introduced by using the (meth)acrylate of the formula:

$$CH_2=C(R_1)-COO-(R_2-O)_n-R_3 \qquad I$$

wherein $R_1$, $R_2$, $R_3$ and n are as defined above for the preparation of the polymer (a). Preferred examples of the (meth)acrylate include (meth)acrylates of ethylene glycol monoethers such as ethylene glycol monomethyl ether (meth)acrylate, ethylene glycol monoethyl ether (meth)acrylate, ethylene glycol monobutyl ether (meth)acrylate, ethylene glycol monoamyl ether (meth)acrylate, ethylene glycol monohexyl ether (meth)acrylate, ethylene glycol monophenyl ether (meth)acrylate and ethylene glycol monobenzyl ether (meth)acrylate; (meth)acrylates of diethylene glycol monoethers such as diethylene glycol monomethyl ether (meth)acrylate, diethylene glycol monoethyl ether (meth)acrylate and diethylene glycol monophenyl ether (meth)acrylate; (meth)acrylates of triethylene glycol monoethers such as triethylene glycol monomethyl ether (meth)acrylate; (meth)acrylates of tetraethylene glycol monoethers; (meth)acrylates of pentaethylene glycol monoethers; (meth)acrylates of propylene glycol monoethers such as propylene glycol monoethyl ether (meth)acrylate and propylene glycol monophenyl ether (meth)acrylate; (meth)acrylates of dipropylene glycol monoethers; (meth)acrylates of tripropylene glycol monoethers; (meth)acrylates of tetrapropylene glycol monoethers; (meth)acrylates of pentapropylene glycol monoethers; (meth)acrylates such as butanediol monoethers, pentanediol monoethers and hexylene glycol monoethers; a mixture thereof; and the like. The (meth)acrylate is used in an amount of 5 to 79% by weight, preferably 7 to 69% by weight, more preferably 10 to 58% by weight, based on the total weight of the monomer used for the preparation of the polymer (a).

When the amount of the (meth)acrylate is smaller than 5% by weight, a pattern formed after exposing and developing two times or more is liable to be inferior, and peeling of the resist layer and cracks are liable to arise. When the amount of the (meth)acrylate exceeds 79% by weight, the amount of the t-butyl ester of the α,β-ethylenically unsaturated carboxylic acid and the other α,β-ethylenically unsaturated compound contained in the polymer (a) becomes small, whereby, it is difficult to form a good pattern.

In order to prepare the polymer (a), the other α,β-ethylenically unsaturated compound is used together with the t-butyl ester of the α,β-ethylenically unsaturated carboxylic acid and the (meth)acrylate. The other α,β-ethylenically unsaturated compound is copolymerized in order to introduce the acid value into the polymer (a), or to control film strength of the resist layer, optionally.

Preferred examples of the other α,β-ethylenically unsaturated compound include α,β-ethylenically unsaturated carboxylic acids, such as acrylic acid, methacrylic acid, crotonic acid, itaconic acid etc.; hydroxyalkyl (meth)acrylates such as 2-hydroxyethyl (meth)acrylate, 2-hydroxypropyl (meth)acrylate and 2-hydroxybutyl (meth)acrylate; (meth)acrylates such as methyl (meth)acrylate, ethyl (meth)acrylate, n-butyl (meth)acrylate, propyl (meth)acrylate, cyclohexyl (meth)acrylate, phenyl (meth)acrylate and benzyl (meth)acrylate; styrene derivatives such as styrene, p-(m-)methylstyrene, α-methylstyrene and p-(m-)chlorostyrene; (meth)acrylonitrile; (meth)acrylamide; vinyl chloride; vinylidine chloride; vinyl acetate; ethylene; propylene; butadiene; a mixture thereof; and the like.

The other α,β-ethylenically unsaturated compound is used in the amount of 1 to 75% by weight, preferably 1 to 63% by weight, more preferably 2 to 50% by weight, based on the total weight of the monomer used for the preparation of the polymer (a). When the amount of the other α,β-ethylenically unsaturated compound is smaller than 1% by weight, the acid value of the polymer is small, and developing defects are liable to arise after exposures and developments are conducted two times or more. When the amount exceeds 75% by weight, the amount of the t-butyl ester of the α,β-ethylenically unsaturated carboxylic acid contained in the polymer (a) is small, whereby, a pattern formed after exposing and developing two times or more is inferior.

The polymer (a) is obtained by copolymerizing the above mentioned α,β-ethylenically unsaturated compounds. The copolymerization is conducted by a substantially known method. For example, radical polymerization may be conducted in a suitable solvent.

It is necessary that the polymer (a) thus obtained has an acid value of 2 to 200. The acid value is easily introduced into the polymer (a) by a method comprising copolymerizing the α,β-ethylenically unsaturated carboxylic acid as the other α,β-ethylenically unsaturated compound, but other method may be used. For example, there can be used a method comprising copolymerizing a hydroxyalkyl (meth)acrylate to introduce a hydroxyl group into a polymer and then reacting it with an acid anhyride such as succinic anhydride, phthalic anhydride, etc., a method comprising introducing a glycidyl group into a polymer and reacting it with dicarboxylic acid and the like. In both cases, the acid value of the polymer (a) may be 2 to 200, preferably 10 to 170, more preferably 15 to 140. When the acid value is smaller than 2, solubility of the resist layer of the exposed part is deteriorated, and developing defects (e.g. residual thin film, residual scum, etc.) is liable to arise when the resist layer is subjected to exposures and developments two times or more. When the acid value exceeds 200, the developed pattern becomes inferior, and it is not preferred.

The positive type resist composition of the present invention contains a photoactivator which generates an acid in response to a light irradiation, in addition to the polymer (a). The photoactivator is a compound which generates a strong acid in response to a light irradiation. The photoactivator is not specifically limited, but onium salts and those which are known as the compounds which generate a sulfonic acid in response to a light irradiation can be used. Typical examples of the onium salts are diaryliodonium salts, triarylsulfonium salts, triarylselenium salts and the like. Preferred counter anions are compounds such as tetrafluoroborate, trifluoromethanesulfonate, hexafluoroantimonate, hexafluoroarsenate and hexafluorophosphate. As the compound which generates a sulfonic acid in response to a light irradiation, for example, there are β-ketosulfon compound, ester compound of nitrobenzyl alcohol and arylsulfonic acid, ester compound of N-hydroxyamide (imide) and sulfonic acid, ester compound of benzoin and sulfonic acid and the like.

These photoactivators can be used alone or in combination thereof. The amount of the photoactivator is 0.1 to 50% by weight, preferably 1 to 30% by weight, based on the total solid content of the positive type resist composition of the present invention. When the amount is smaller than 0.1% by weight, the amount of the acid generated is small and, therefore, it becomes difficult to cause the reaction. On the contrary, when the amount exceeds 50% by weight, not only the filling effect is not obtained, but sufficient film strength of the resist layer is hardly obtained, and it is not preferred.

In the present invention, developing defects (e.g. residual thin film, residual scum, etc.) hardly arise when the resist layer is subjected to exposure and development two times or more, so that a good pattern can be formed. Further, since good adhesion is provided between the resist layer and the substrate, peeling of the resist layer and cracks hardly arise even when a colored layer or transparent layer is formed by an electrodeposition process after the formation of a pattern.

The positive type resist composition of the present invention may optionally contain a dye, a plasticizer and a photosensitizer (which enhances acid-generating efficiency of the photoactivator).

As the photosensitizer, those which are known to the art can be used. For example, polycyclic aromatic compounds such as pyrene and perylene can be used. The molar ratio of the photosensitizer to the photoactivator is 0.01:1 to 10:1, preferably 0.1:1 to 5:1.

Upon use, the positive type resist composition of the present invention thus obtained is dissolved in a suitable solvent to apply on a substrate. Preferred examples of the solvent include ketones such as acetone, methyl ethyl ketone, methyl isobutyl ketone and cyclohexanone; esters such as ethyl acetate, butyl acetate, methyl cellosolve acetate, ethyl cellosolve acetate and propylene glycol monomethyl ether acetate; ethers such as dioxane, tetrahydrofuran, diethoxyethane and diethylene glycol dimethyl ether; a mixture thereof; and the like.

In the present invention, a solution of the resist composition is applied on a substrate and dried to form a resist layer. The resist layer is exposed to light through a mask having a predetermined pattern and optionally heated to about 50° to 180° C., and then developed with an alkali developer to form a pattern. Further, the pattern may be subjected to an electrodeposition or dyeing process. The non-exposed part of the resist layer can be exposed and developed again to repeat a process for forming a pattern.

The substrate is not specifically limited and examples thereof include silicon, glass, plastic, paper and the like. When the electrodeposition process is conducted, a substrate having electrical conductivity may be used. For example, a substrate wherein a conductive substrate (e.g. chrome, nickel, indium oxide, etc.) is formed on an insulated substrate (e.g. glass, plastic, etc.) or a conductive substrate (e.g. iron, stainless steel, copper, etc.) can be used.

The coating method may be any which is known to the art, and examples thereof include rotational coating, wire-bar coating, dip coating, air-knife coating, roll coating, blade coating, curtain coating and the like.

As the light source for irradiating light, for example, there can be used an ultrahigh pressure mercury lamp, high pressure mercury lamp, low pressure mercury lamp, metal halide lamp, xenone lamp, KrF excimer laser and the like. By heating the resist layer at about 50° to 180° C., the reaction wherein the t-butyl ester group in the polymer (a) is decomposed by a catalytic reaction with the acid generated from the photoactivator to generate the isobutene and carboxyl group can be promoted.

Preferred examples of the alkaline compound for the developer include inorganic alkalis such as potassium hydroxide, sodium hydroxide, potassium carbonate, sodium carbonate, potassium metasilicate, sodium metasilicate, sodium secondary phosphate and ammonia; alkylamines such as ethylamine, diethylamine, triethylamine, isopropylamine, n-butylamine and isobutylamine; alcoholamines such as ethanolamine, diethanolamine, triethanolamine, methyldiethanolamine, dimethylethanolamine and diethylethanolamine; quaternary ammonium salts such as tetramethylammonium hydroxide, tetraethylammonium hydroxide, and trimethyl(2-hydroxyethyl)ammonium hydroxide; a solution of cyclic amines such as pyrrol and piperidine; and the like. Further, additives such as surfactants, wetting agents, stabilizing agents and organic solvents can be optionally added to the developer.

The resist layer may be developed by any known method of bringing the resist layer into contact with the developer, for example, dipping method, puddle method, spraying method, a mixture thereof and the like. Further, the development may be conducted by heating.

According to the present invention, there is provided a positive type resist composition which can forms a good pattern by subjecting a resist layer to plural exposures and developments, which results in excellent adhesion between the resist layer and a substrate.

EXAMPLES

The following Examples further illustrate the present invention in detail but are not to be construed to limit the scope thereof. In Examples, all "parts" are by weight, unless otherwise stated.

Preparation Example 1

A reaction vessel was charged with methyl isobutyl ketone (149 parts) and heated to 85° C. A monomer solution obtained by dissolving t-butyl methacrylate (80 parts), methacrylic acid (10 parts), diethylene glycol monoethyl ether acrylate (10 parts) and t-butylperoxy-2-ethylhexanoate (1 part) with mixing was added dropwise to the reaction vessel over 2 hours. Further, the mixture was reacted for 4 hours to obtain a polymer. After cooling, methyl isobutyl ketone (250 parts) and triphenylsulfonium hexafuluoloantimonate (15 parts) were added to the reaction solution to obtain a positive type resist composition. The polymer had an acid value of 68.

Preparation Example 2

According to the same manner as that described in Preparation Example 1, a positive type resist composition containing a polymer from the formulation of t-butyl methacrylate (70 parts), dipropylene glycol mono methyl ether acrylate (10 parts) and methacrylic acid (20 parts), and triphenylsulfonium hexafluoroantimonate (5 parts) was obtained. The acid value of the polymer was 137.

Preparation Example 3

According to the same manner as that described in Preparation Example 1, a positive type resist composition containing a polymer from the formulation of t-butyl methacrylate (65 parts), triethylene glycol monomethyl ether methacrylate (30 parts) and acrylic acid (5 parts) was obtained. The acid value of the polymer was 41.

Preparation Example 4

According to the same manner as that described in Preparation Example 1, a positive type resist composition containing a polymer from the formulation of t-butyl methacrylate (40 parts), ethylene glycol monophenyl ether methacrylate (57 parts) and methacrylic acid (3 parts) was obtained. The acid value of the polymer was 20.

Preparation Example 5

According to the same manner as that described in Preparation Example 1, a positive type resist composition containing a polymer from the formulation of t-butyl acrylate (40 parts), ethylene glycol monophenyl ether methacrylate (18 parts), methyl methacrylate (39 parts) and methacrylic acid (3 parts) was obtained. The acid value of the polymer was 20.

Preparation Example 6

According to the same manner as that described in Preparation Example 1, a positive type resist composition containing a polymer from the formulation of t-butyl acrylate (30 parts), di-t-butyl maleate (10 parts), diethylene glycol monoethyl ether acrylate (10 parts), methyl methacrylate (28 parts), n-butyl methacrylate (20 parts) and methacrylic acid (3 parts) was obtained. The acid value of the polymer was 20.

Preparation Example 7

A reaction vessel was charged with ethylene glycol monoethyl ether acetate (149 parts) and heated to 100° C. A monomer solution obtained by dissolving t-butyl methacrylate (80 parts), diethylene glycol monoethyl ether acrylate (10 parts), 2-hydroxyethyl methacrylate (10 parts) and t-butylperoxy-2-ethylhexanoate (1 part) with mixing was added dropwise to the reaction vessel over 2 hours. After the mixture was reacted for 2 hours, phthalic anhydride (11 parts) was added and heated to 120° C. to obtain a polymer. After cooling, methyl isobutyl ketone (250 parts) and triphenylsulfonium hexafuluoloantimonate (15 parts) were added to the reaction solution to obtain a positive type resist composition. The polymer had an acid value of 38.

Preparation Example 8

According to the same manner as that described in Preparation Example 1 except for adding 2,6-dinitrobenzene tosylate (20 parts) in place of triphenylsulfonium hexafluoroantimonate (15 parts), a positive type resist composition was obtained.

Comparative Preparation Example 1

According to the same manner as that described in Preparation Example 1, a positive type resist composition containing a polymer from the formulation of t-butyl acrylate (100 parts) was obtained. The acid value of the polymer was 0.

Comparative Preparation Example 2

According to the same manner as that described in Preparation Example 1, a positive type resist composition containing a polymer from the formulation of t-butyl acrylate (90 parts) and methacrylic acid (10 parts) was obtained. The acid value of the polymer was 68.

Comparative Preparation Example 3

According to the same manner as that described in Preparation Example 1, a positive type resist composition containing a polymer from the formulation of t-butyl acrylate (90 parts) and diethylene glycol monoethyl ether acrylate (10 parts) was obtained. The acid value of the polymer was 0.

Comparative Preparation Example 4

According to the same manner as that described in Preparation Example 1, a positive type resist composition containing a polymer from the formulation of t-butyl acrylate (80 parts), ethylhexyl acrylate (10 parts) and methacrylic acid (10 parts) was obtained. The acid value of the polymer was 68.

Comparative Preparation Example 5

According to the same manner as that described in Preparation Example 1, a positive type resist composition containing a polymer from the formulation of t-butyl acrylate (10 parts), methyl methacrylate (70 parts), diethylene glycol monoethyl ether acrylate (10 parts) and methacrylic acid (10 parts) was obtained. The acid value of the polymer was 68.

Example 1

A positive type resist composition of Preparation Example 1 was applied on a glass substrate, on which an ITO transparent electrode was formed, using a spinner such that the dry coating thickness became 2.5μ, followed by drying with heating at 120° C. for 10 minutes to form a resist layer. Then, the resist layer was subjected to the first exposure through a mask having a pattern of 10μ lines and spaces, using a 500 W ultra high pressure mercury lamp [manufactured by Dainippon Screen Seizo Co., 250 mJ/cm² (about 365 nm)]. Thereafter, it was heated at 120° C. for 5 minutes and subjected to the first development by dipping in a 5% by weight of an aqueous solution of diethyl ethanolamine at 40° C. for 2 minutes with stirring. As a result, the exposed part was eluted to form a predetermined positive type pattern, whereby, the ITO transparent electrode was exposed. After drying at 100° C. for 10 minutes with heating, the substrate was dipped in an acryl-melamine anionic electrodeposition solution and connected to the ITO electrode as a positive electrode, and electrodeposition was conducted by applying a direct current (30 V) such that the dry coating thickness of the colored layer became 2.5μ. The coated substrate was then taken out from the vessel and sufficiently rinsed with water. In this case, the electrodeposition was coated on the exposed ITO transparent electrode according to the pattern of the resist layer to form a good pattern of 10μ width due to the colored layer. Further, no electrodeposition was coated on the resist layer which was present on the ITO transparent electrode, and the resist layer had sufficient adhesion and dielectric strength with the substrate. After rinsing with water, the electrocoat was cured by heating at 150° C. for 30 minutes. Then, the non-exposed part was subjected to the second exposure through a mask having a predetermined pattern, followed by heating at 120° C. for 5 minutes. It was subjected to the second development using the above developer. As a result, the exposed part was eluted to form a predetermined positive type pattern without residual thin film and scum.

Examples 2 to 8

According to the same manner as that described in Example 1, the positive type resist compositions of Examples 2 to 8 were evaluated. After the first and second development, a good pattern could be formed without residual thin film and scum. A pattern formed by a colored layer after electrodeposition and rinsing with water was good. Further, no electrodeposition was coated on a resist layer, and the resist layer had sufficient adhesion and dielectric strength.

Comparative Examples 1

According to the same manner as that described in Example 1, the positive type resist composition of Comparative Preparation Example 1 was evaluated. After the first development, good pattern could be formed. However, a part of the resist layer was peeled off upon electrodeposition, and adhesion between the resist layer and the substrate was insufficient. Since an electrodeposition was coated on the ITO transparent electrode at the peeled part, a pattern formed by the colored layer became inferior. After the second development, a residual thin film and residual scum were formed on the pattern.

Comparative Examples 2 and 3

According to the same manner as that described in Example 1, the positive type resist compositions of Comparative Preparation Examples 2 and 3 were evaluated. After the first development, a good pattern could be formed. A pattern formed by the colored layer after electrodeposition and rinsing with water was good. Further, no electrodeposition was formed on the resist layer, and the resist layer has sufficient adhesion and dielectric strength. However, a residual thin film and residual scum were formed on the pattern after the second development.

Comparative Example 4

According to the same manner as that described in Example 1, the positive type resist composition of Comparative Example 4 was evaluated. The resist layer was opaque after the application of a resist and drying. A pattern after the first and second development was inferior in linearity.

Comparative Examples 5

According to the same manner as that described in Example 1, the positive type resist composition of Comparative Preparation Example 5 was evaluated. After the first development, no pattern was formed.

The results obtained in Examples 1 to 8 and Comparative Examples 1 to 5 as well as the formulation of a positive type resist composition are shown in Tables 1 and 2 below.

TABLE 1

| Component (part) | Ex. 1 | Ex. 2 | Ex. 3 | Ex. 4 | Ex. 5 | Ex. 6 | Ex. 7 | Ex. 8 |
|---|---|---|---|---|---|---|---|---|
| t-Butyl methacrylate | 80 | 70 | 65 | 40 | — | — | 80 | 80 |
| t-Butyl acrylate | — | — | — | — | 40 | 30 | — | — |
| di-t-Butyl maleate | — | — | — | — | — | 10 | — | — |
| EGPMA *1 | — | — | — | 57 | 18 | — | — | — |
| TEGEMA *2 | — | — | 30 | — | — | — | — | — |
| DEGEA *3 | 10 | — | — | — | — | 10 | 10 | 10 |
| DPGMA *4 | — | 10 | — | — | — | — | — | — |
| Methacrylic acid | 10 | 20 | — | 3 | 3 | 3 | — | 10 |
| Acrylic acid | — | — | 5 | — | — | — | — | — |
| HEMA + PAn *5 | — | — | — | — | — | — | 10 + 11 | — |
| Methyl methacrylate | — | — | — | — | 39 | 28 | — | — |
| n-Buthyl methacrylate | — | — | — | — | — | 19 | — | — |
| Ethylhexyl acrylate | — | — | — | — | — | — | — | — |
| TPSHFSb *6 | 15 | 5 | 15 | 15 | 15 | 15 | 15 | — |
| 2,6-DNBTs *7 | — | — | — | — | — | — | — | 20 |
| Acid value | 68 | 137 | 41 | 20 | 20 | 20 | 38 | 68 |
| Pattern *8 | A | A | A | A | A | A | A | A |
| Adhesion *8 | A | A | A | A | A | A | A | A |

*1 Ethylene glycol monophenyl ether methacrylate
*2 Triethylene glycol monomethyl ether methacrylate
*3 Diethylene glycol monoethyl ether acrylate
*4 Dipropylene glycol monomethyl ether acrylate
*5 2-Hydroxyethyl methacrylate + phthalic anhydride
*6 Triphenylsulfonium hexafluoroantimonate
*7 2,6-Dinitrobenzyl tosylate
*8 Pattern and adhesion after 2nd development
A: good, B: poor

TABLE 2

| Component (part) | Comp. Ex. 1 | Comp. Ex. 2 | Comp. Ex. 3 | Comp. Ex. 4 | Comp. Ex. 5 |
|---|---|---|---|---|---|
| t-Butyl methacrylate | 100 | 90 | 90 | 80 | 10 |
| t-Butyl acrylate | — | — | — | — | — |
| di-t-Butyl maleate | — | — | — | — | — |
| EGPMA *1 | — | — | — | — | — |
| TEGEMA *2 | — | — | — | — | — |
| DEGEA *3 | — | — | 10 | — | 10 |
| DPGMA *4 | — | — | — | — | — |
| Methacrylic acid | — | 10 | — | 10 | 10 |
| Acrylic acid | — | — | — | — | — |
| HEMA + PAn *5 | — | — | — | — | — |

TABLE 2-continued

| Component (part) | Comp. Ex. 1 | Comp. Ex. 2 | Comp. Ex. 3 | Comp. Ex. 4 | Comp. Ex. 5 |
| --- | --- | --- | --- | --- | --- |
| Methyl methacrylate | — | — | — | — | 70 |
| n-Buthyl methacrylate | — | — | — | — | — |
| Ethylhexyl acrylate | — | — | — | 10 | — |
| TPSHFSb *6 | 15 | 15 | 15 | 15 | 15 |
| 2,6-DNBTs *7 | — | — | — | — | — |
| Acid value | 0 | 68 | 0 | 68 | 68 |
| Pattern *8 | B | B | B | B | B |
| Adhesion *8 | B | B | B | B | B |

*1 Ethylene glycol monophenyl ether methacrylate
*2 Triethylene glycol monomethyl ether methacrylate
*3 Diethylene glycol monoethyl ether acrylate
*4 Dipropylene glycol monomethyl ether acrylate
*5 2-Hydroxyethyl methacrylate + phthalic anhydride
*6 Triphenylsulfonium hexafluoroantimonate
*7 2,6-Dinitrobenzyl tosylate
*8 Pattern and adhesion after 2nd development
A: good; B: poor

What is claimed is:

1. A positive type resist composition which comprises:

(a) a polymer having an acid value of 2 to 200, prepared from 20 to 94% by weight of a t-butyl ester of an α,β-ethylenically unsaturated carboxylic acid, 5 to 79% by weight of a (meth)acrylate of the formula:

$$CH_2=C(R_1)-COO-(R_2-O)_n-R_3 \quad \text{I}$$

wherein $R_1$ is hydrogen or a methyl group, $R_2$ represents $$-\overset{R_4}{\underset{R_5}{C}}-R_6-$$

wherein $R_4$ represents hydrogen or an alkyl group, $R_5$ represents hydrogen or an alkyl group, $R_6$ represents a branched or straight chain alkylene group, provided that a total carbon number of $R_4$, $R_5$ and $R_6$ is 1 to 5, $R_3$ is an alkyl group having 1 to 6 carbon atoms, an aryl group or an aralkyl group and n is an integer of 1 to 10 and 1 to 75% by weight of another α,β-ethylenically unsaturated compound other than the above two mentioned monomers; and (b) a photoactivator which generates an acid in response to a light irradiation.

2. The positive type resist composition according to claim 1, wherein said t-butyl ester of α,β-ethylenically unsaturated carboxylic acid is selected from the group consisting of t-butyl esters of monocarboxylic acids, dicarboxylic acids, acid anhydrides and monoesters of dicarboxylic acids, and a mixture thereof.

3. The positive type resist composition according to claim 1, wherein said (meth)acrylate is selected from the group consisting of (meth)acrylates of ethylene glycol monoethers, (meth)acrylates of di(ethylene glycol) monoethers, (meth)acrylates of tri(ethylene glycol) monoethers, (meth)acrylates of tetra(ethylene glycol) monoethers, (meth)acrylates of penta(ethylene glycol) monoethers, (meth)acrylates of propylene glycol monoethers, (meth)acrylates of di(propylene glycol) monoethers, (meth) acrylates of tri(propylene glycol) monoethers, (meth)acrylates of tetra(propylene glycol) monoethers, (meth)acrylates of penta(propylene glycol) monoethers, and mixtures thereof.

4. The positive type resist composition according to claim 1, wherein said other α,β-ethylenically unsaturated compound is selected from the group consisting of acrylic acid, methacrylic acid, hydroxyalkyl (meth)acrylates, (meth)acrylates other than t-butyl esters of α,β-ethylenically unsaturated carboxylic acid and (meth)acrylates of the formula (I), styrene derivatives, (meth)acrylonitrile, (meth)acrylamide, vinyl chloride, vinylidine chloride, vinyl acetate, ethylene, propylene, butadiene, and a mixture thereof.

5. The positive type resist composition according to claim 1, wherein said photoactivator is selected from the group consisting of onium salts and compounds which generate a sulfonic acid in response to a light irradiation.

* * * * *